(12) United States Patent
Limelette et al.

(10) Patent No.: US 6,745,945 B1
(45) Date of Patent: Jun. 8, 2004

(54) METHOD FOR MAKING CONTACTLESS CARDS BY LAMINATION AND CONTACTLESS CARD OBTAINED BY SAID METHOD

(75) Inventors: Yann Limelette, Mardie (FR); Hayat El Yamani, L'Hay les Roses (FR); Pierre Volpe, Mardie (FR)

(73) Assignee: Schlumberger Systemes, Montrouge (FR)

( * ) Notice: Subject to any disclaimer, the term of this patent is extended or adjusted under 35 U.S.C. 154(b) by 0 days.

(21) Appl. No.: 10/030,322
(22) PCT Filed: Apr. 28, 2000
(86) PCT No.: PCT/FR00/01136
§ 371 (c)(1),
(2), (4) Date: May 8, 2002
(87) PCT Pub. No.: WO00/67199
PCT Pub. Date: Nov. 9, 2000

(30) Foreign Application Priority Data

Apr. 29, 1999 (FR) ............................................. 99 05479

(51) Int. Cl.⁷ .............................................. G06K 19/06
(52) U.S. Cl. ........................................ 235/492; 235/487
(58) Field of Search .......................................... 235/492

(56) References Cited

FOREIGN PATENT DOCUMENTS

| EP | 0 706 152 A2 | 4/1996 |
| EP | 0 737 935 A2 | 10/1996 |
| FR | 2 756 955 | 6/1998 |

*Primary Examiner*—Harold Pitts
(74) *Attorney, Agent, or Firm*—Osha Novak & May L.L.P.

(57) ABSTRACT

The invention concerns a method for producing a portable object having a card format and comprising:—an object body including a plastic support sheet (12), a plastic incorporation sheet (18), and a first (19) and second (20) external covering sheet; an antenna (11) provided with two antenna terminals (13); and an integrated circuit chip (14) incorporated in an incorporation sheet (18) and electrically connected to the antenna. The method of the invention is characterised in that it comprises stages according to which: the support sheet (12) on which the chip (14) has been mounted with the incorporation sheet (18) so as to obtain a first rolled unit; and in a subsequent stage the first rolled unit is covered with the first (19) and second (20) external covering sheets. The invention can be applied in particular to the production of contactless cards by means of hot rolling.

4 Claims, 3 Drawing Sheets

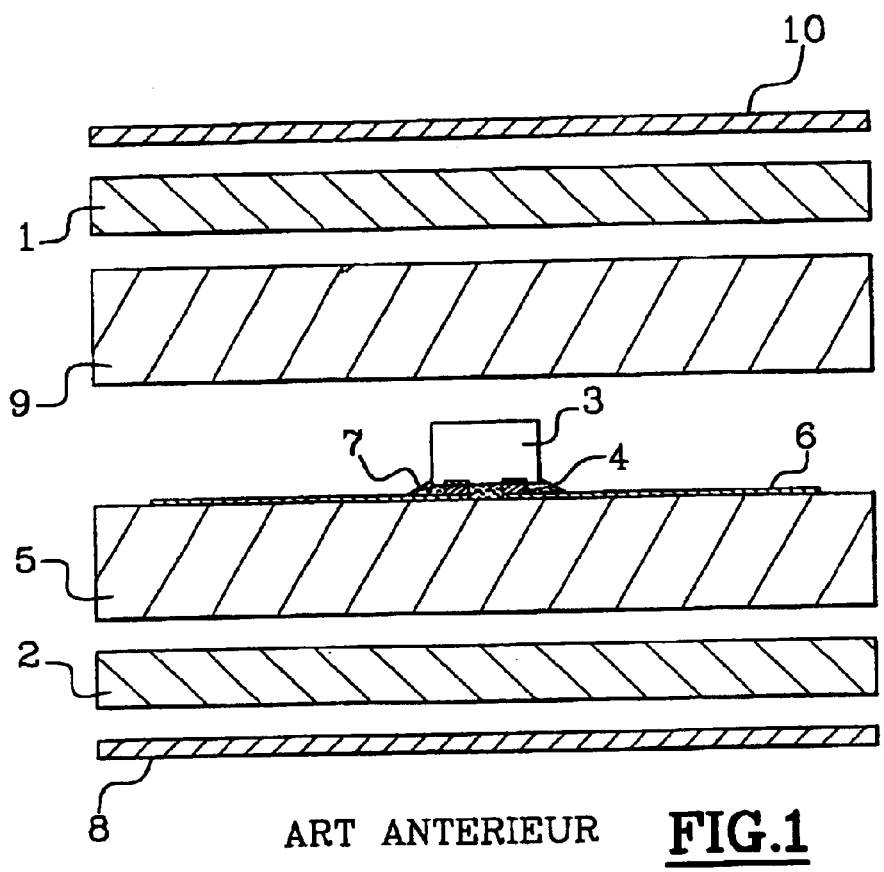
ART ANTERIEUR FIG.1
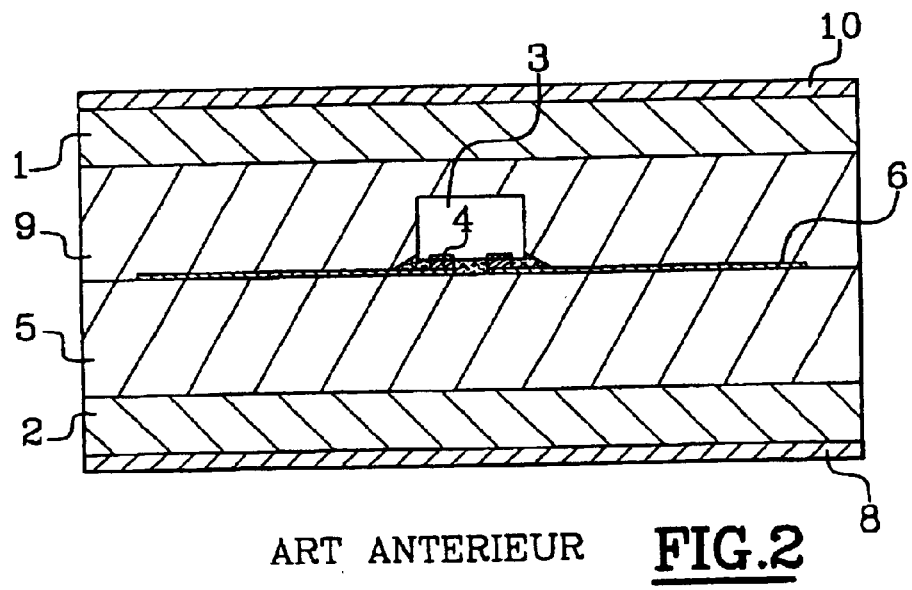
ART ANTERIEUR FIG.2

METHOD FOR MAKING CONTACTLESS CARDS BY LAMINATION AND CONTACTLESS CARD OBTAINED BY SAID METHOD

FIELD OF THE INVENTION

The present invention concerns a method for producing portable objects with a card format and in particular objects comprising firstly a plastic object body composed of plastic sheets covered by external covering sheets or overlays, and secondly an antenna whose two terminals are connected to the connection pads of an integrated circuit chip embedded in the card body.

These portable objects with a card format are suitable for functioning with electric contact with the aid of an inductive coupling between the antenna of the card body and that of an associated reader. They are used in particular as a badge or transport right for access to protected premises.

BACKGROUND OF THE INVENTION

So as to produce these objects, the method is carried out conventionally as shown on the accompanying FIGS. 1 and 2.

First of all, polycarbonate sheets (PC) are offset-printed in four colours. The front of a first sheet 1 of PC is printed and the back of a second sheet 2 is printed.

In addition, a predetermined number of chips 3, previously provided with protuberances 4, is mounted on a PVC support sheet 5 and so as to electrically connect the connection pads of each of said chips 3 to the terminals of an antenna 6 serigraphed on the surface of the support sheet 5. A sealing resin 7 is then deposited at the location of the connections and on the active face of the chip 3.

Then, after having serigraphed a thermoactivable glue on each sheet, the following are superimposed in the following order: a first external coating sheet 8, the second sheet 2 of PC, the support sheet 5 bearing the chip 3 and the antenna 6, a sheet 9 for incorporating this chip 3, the first sheet 1 of PC and a second external coating sheet 10. The sheets 5, 9, 8 and 10 are PVC sheets. This results in obtaining a superimposed unit with the thicknesses of the various sheets being the following:

first external coating sheet: 50 μm
first PC sheet: 150 μm
incorporation sheet: 300 μm
support sheet: 190 μm
chip: 260 μm
second PC sheet: 150 μm
second external coating sheet: 50 μm This unit is then subjected to a first and then second hot rolling according to defined temperature and pressure cycles. In particular, the first rolling, carried out at a temperature of about 140° C., is intended to glue the sheets making up the unit via activation of the thermoactivable glue and to ensure that the chips 3 are incorporated in the incorporation sheet 9, and the second rolling carried out similarly at a temperature of about 140° C., is intended to improve firstly adherence between the various sheets of the unit, and secondly the surface condition of said unit.

Then the rolled unit is cut and finally portable objects with a card format are obtained as defined in the standard ISO 7816-1, that is with a thickness of about 0.760 mm, a length 85 mm and a width of about 54 mm.

However, the method described above has certain drawbacks.

It requires the presence of two main thermoplastic materials: PC and PVC. Now, the vitreous transition temperature of the PC, which is about 150° C., is higher than the vitreous transition temperature of PVC which is only about 70° C. Thus, the PC does not reach its vitreous transition temperature during the first and second rollings. This is why it is necessary to glue the various sheets together using a glue.

Moreover, control of the offset printing of the PC is imperfect, as with the cutting of this plastic material, originating from imperfections of cards.

Of course, so as to mitigate the drawbacks of the method described above, it has been considered replacing the PC sheets by PVC sheets. However, the cards then obtained would have exhibited on their surface and on the vertical line above and below the chip appearance defects consisting of the presence of white traces due at these locations to a polymerisation/depolymerisation of the PVC of the various sheets of the rolled unit and in particular of the covering sheets in specific conditions differing from conditions existing in the rest of the card body.

SUMMARY OF THE INVENTION

Also having regard to the above, a problem which the invention seeks to resolve consists of embodying a method for producing a portable object with a card format comprising:

an object body comprising a plastic support sheet, a plastic incorporation sheet, as well as a first and a second external covering sheet;

an antenna provided with two antenna terminals, and an integrated circuit chip provided with two connection pads, said chip being incorporated in the incorporation sheet, each of said connection pads being electrically connected to one antenna terminal, said method comprising a next stage according to which:

the chip is mounted on the support sheet, a method which mitigates the above drawbacks and in particular makes it possible to avoid using PC but without the cards obtained having appearance defects.

In the light of this problem, the solution of the invention consists of providing a method of said type characterised in that it comprises the following stages according to which:

the support sheet is rolled on which the chip is mounted with the incorporation sheet so as to obtain a first rolled unit in which the chip is incorporated in the incorporation sheet, and in a subsequent stage, the first rolled unit is covered with the first and second recovering sheets.

Thus, by proceeding in two stages with the obtaining of a first PVC rolled unit and then by covering this first unit with covering sheets, it is possible to use solely a given plastic for the production of the sheets of the portable object in a card format and in particular to avoid using PC but without the card having appearance defects.

The following non-restrictive description clearly shows how the invention can be used in practice with reference to the accompanying drawings on which:

BRIEF DESCRIPTION OF THE DRAWINGS

FIG. 1 exploded cross-sectional view showing a method for producing a card according to the prior art;

FIG. 2 is a cross-sectional view showing a card obtained according to a method of the prior art.

DETAILED DESCRIPTION

Figure 3:
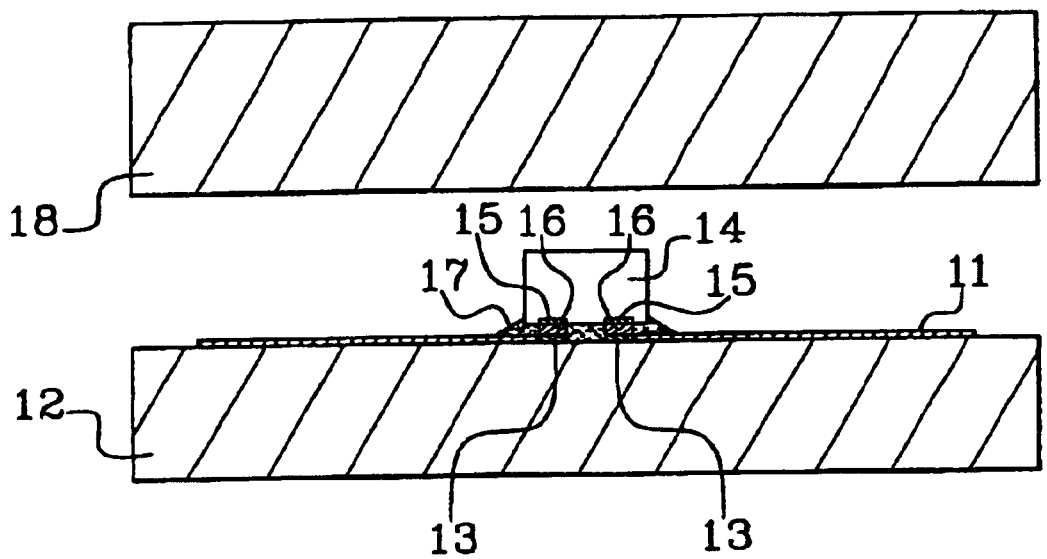
FIG. 3 is a cross-sectional view showing a rolling stage of a method for producing a card according to the invention.

The object of the invention is to provide portable chip objects in a card format. These objects are in particular defined in the standards ISO7810, ISO7816, in the tentative standard ISO14443 and in the standards ETSI/GSM11.11 and ESTI/GSM11.14 whose contents are integrated in the present document by way of reference.

The production of these objects is advantageously implemented on large sheets. For example, the width of these sheets is about 22 cm and their length is about 32 cm. Thus, it is possible to quickly obtain, after cutting, a large number of cards. In said example, this number is about 10.

However, so as to facilitate reading of the following description, the invention is described basically with regard to the production of a single card.

According to the invention, so as to produce one card, an antenna 11 is serigraphed on the surface of a support sheet 12.

The support sheet 12 is plastic, in particular and advantageously made of PVC with a vitreous transition temperature of about 70° C. and having a thickness of about 190 $\mu$m.

The antenna 11 appears in the form of a spiral of three spires of an epoxy-based conductive ink charged with silver and whose extremities constitute two terminals 13 situated close to each other.

In a subsequent stage, an integrated circuit chip 14 is mounted on the terminals 13 of the antenna 11 so as to connect contact pads 15 of said chip 14 to the terminals 13 of the antenna 11.

The shape of this chip 14 is approximately parallelpiped and rectangular with a thickness of 260 $\mu$m with sides of 2 mm. It comprises an active face provided with at least two contact pads 15. These pads 15 are provided with protuberances 16 or bumps made of a thermoplastic or duroplastic conductive polymer, such as an epoxy-based polymer charged with silver.

A sealing resin 17 is deposited in liquid form onto one side of the chip 14 corresponding to its active face. This sealing resin migrates via capillar action under the chip 14, coats the connection elements, that is the contact pads 15, the protuberances 16 and the terminals 13 of the antenna 11, and seals the chip 14 to the support sheet 12.

Afterwards, as shown on FIG. 3, an incorporation sheet 18 is superimposed on the support sheet 12 on which the chip 14 has been mounted. This sheet 18 is a plastic sheet, especially thermoplastic and advantageously a thermoplastic having a low vitreous transition temperature. This in particular is made of PVC whose vitreous transition temperature is about 70° C.

According to the invention, the superimposed unit is rolled at a temperature of about 140° C. and under pressure according to a specific cycle. For example, the unit is subjected to a temperature of 140° C. and a pressure of 10 bars for 10 minutes, then the pressure is increased for 7 minutes until reaching 100 bars when said pressure is stabilised for 4 minutes. The temperature is then lowered to 20° C. and the unit is subjected to a pressure of 200 bars for 18 minutes.

Figure 4:
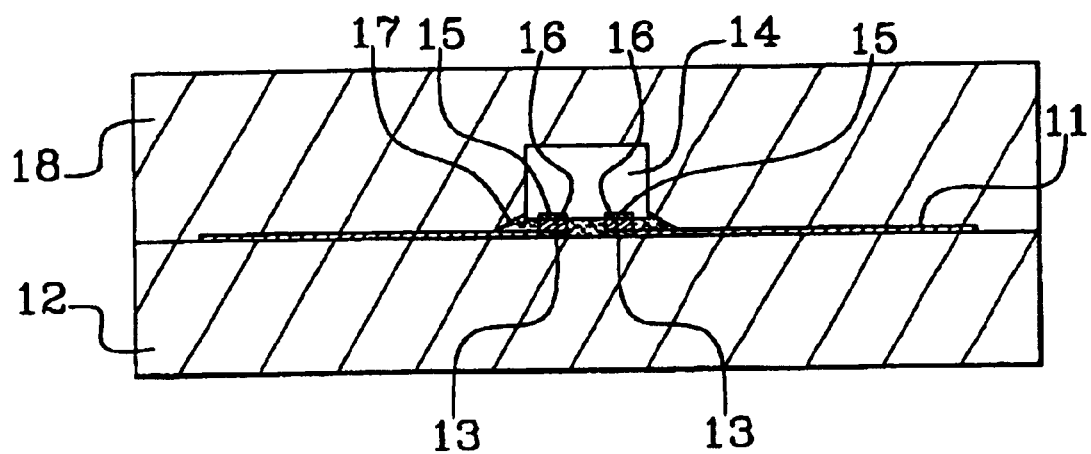
FIG. 4 is a cross-sectional view showing the first unit obtained according to the rolling stage of the invention.

FIG. 4 shows the first rolled unit obtained. In this first unit, the chip 14 is incorporated with the incorporation sheet 18, said sheet 18 in fact having been subjected to temperature and pressure conditions so that it has undergone melting enabling said chip 14 to be integrated. This first rolled unit is called an inlet. It can be stored and handled without risking damaging the chip 14 or the antenna 11, these elements being fully embedded in said unit.

In another stage of the invention, a first covering sheet 19 and a second covering sheet 20 are offset printed in four colours and in inverted images, the first sheet 19 front side and the second 20 rear side. These sheets 19, 20 are plastic and in particular thermoplastic and advantageously are made of PVC having a thickness of about 50 $\mu$m.

Figure 5:
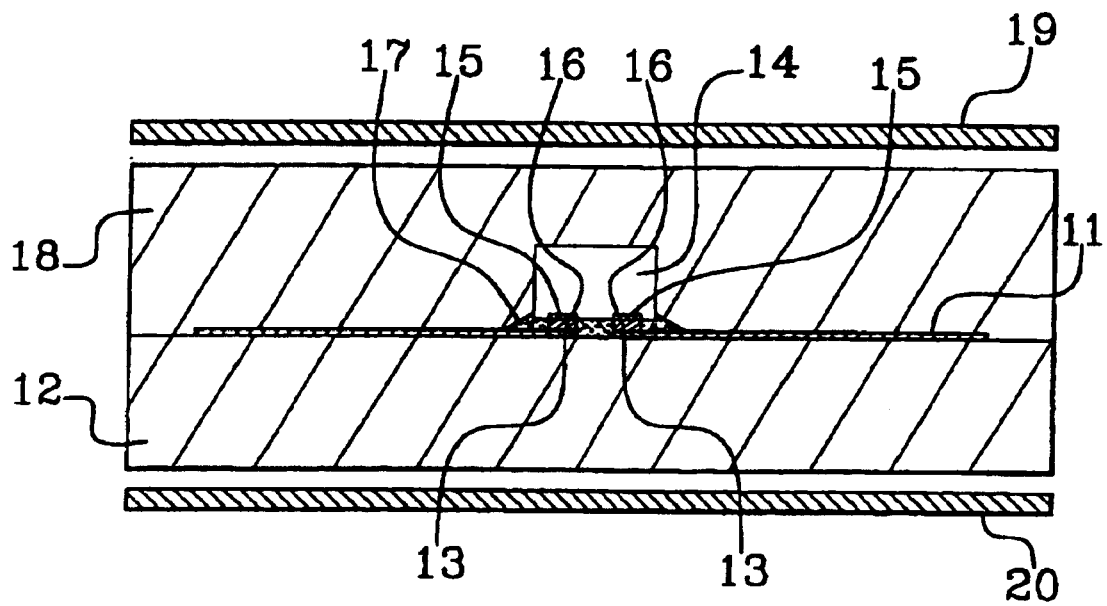
FIG. 5 is an exploded cross-sectional view showing a stage for rolling the first unit with the covering sheets of the invention.
Figure 6:
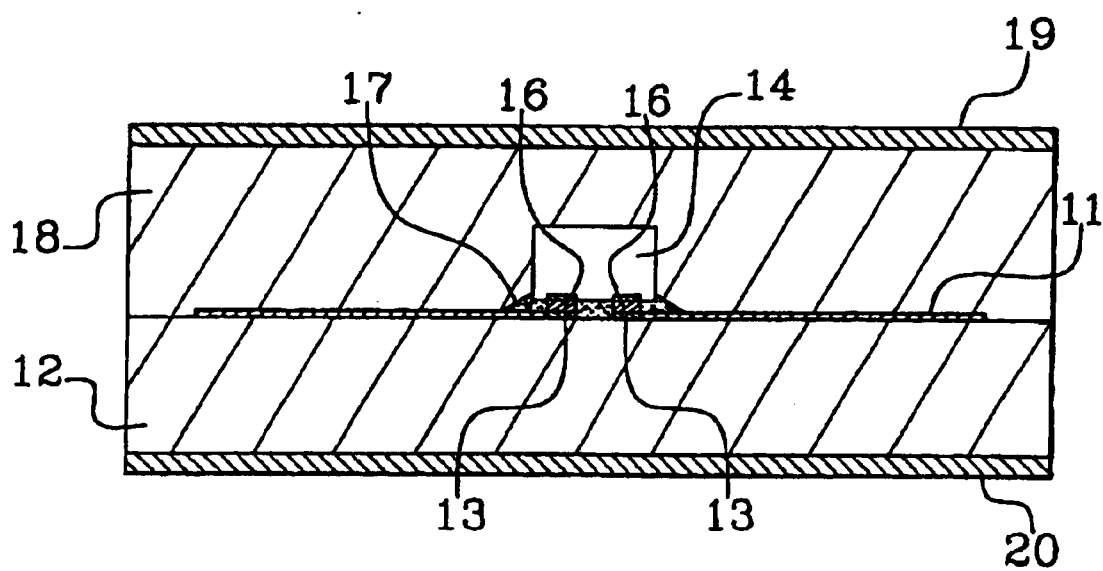
FIG. 6 is a cross-sectional view showing a card obtained according to the method of the invention.

As shown on FIG. 5, the first rolled unit is then covered with two covering sheets 19, 20. The first sheet 19 directly covers the incorporation sheet 18 and the second sheet 20 directly covers the support sheet 12, the printed sides of said sheets 19, 20 being in contact with said sheets 18, 12 respectively. This stage of the invention in, which the first unit is covered can advantageously be accompanied by a second rolling of said first unit with the sheets 19, 20. This second rolling is carried out according to a temperature and pressure cycle of said type allowing the welding of the two covering sheets with the first rolled unit. In practice, the temperature reached during this cycle is about 140° C.

Thus, a second rolled unit is obtained which can be cut to a card format.

The cards obtained in fact only comprise four main thicknesses constituted by the sheets 19, 12, 18 and 20, a chip being borne by the sheet 12 and incorporated in the sheet 18. All these thicknesses are advantageously constituted by the same plastic material, namely PVC.

What is claimed is:

1. A method of producing a portable object in a card format the portable object comprising:

a body including a plastic support sheet, a plastic incorporation sheet, as well as a first external covering sheet and a second external covering sheet;

an antenna provided with two antenna terminals, and an integrated circuit chip provided with two connection pads, said chip being incorporated in the incorporation sheet, each of said two connection pads being electrically connected to one terminal of the antenna, said method comprising the following steps:
the chip is mounted on the support sheet,
the support sheet on which the chip has been mounted is rolled with the incorporation sheet so as to obtain a first rolled unit in which the chip is incorporated in the incorporation sheet and;
the first rolled unit is covered with the first and second external covering sheets.

2. The method according to claim 1, wherein the support sheet, the incorporation sheet, and the first and second external covering sheets are made of thermoplastic, namely PVC.

3. The method according to claim 1, wherein the first covering sheet directly covers the incorporation sheet and in that the second covering sheet directly covers the support sheet.

4. The method according to of claim 1, wherein the stage in which the first rolled unit is covered with the first and second external covering sheets is accompanied by a rolling of the first rolled unit with said first and second covering sheets.

* * * * *